United States Patent

Okerman et al.

(10) Patent No.: US 10,784,672 B2
(45) Date of Patent: Sep. 22, 2020

(54) CIRCUIT INTERRUPTER WITH SELF-TEST CIRCUIT AND METHOD OF OPERATING A CIRCUIT INTERRUPTER

(71) Applicant: EATON INTELLIGENT POWER LIMITED, Dublin (IE)

(72) Inventors: Jason Kohei Arthur Okerman, Pittsburgh, PA (US); Andrew William Courson, McGrann, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 323 days.

(21) Appl. No.: 15/937,991

(22) Filed: Mar. 28, 2018

(65) Prior Publication Data

US 2019/0305541 A1 Oct. 3, 2019

(51) Int. Cl.
*H02H 3/05* (2006.01)
*H02H 1/00* (2006.01)
*H01H 50/44* (2006.01)
*H02H 9/04* (2006.01)
*H02H 3/16* (2006.01)

(52) U.S. Cl.
CPC .............. *H02H 3/05* (2013.01); *H01H 50/44* (2013.01); *H02H 1/0015* (2013.01); *H02H 3/16* (2013.01); *H02H 9/04* (2013.01)

(58) Field of Classification Search
CPC ......... H02M 3/05; H02H 3/08; H02H 1/0015; H02H 3/16; H02H 3/18; H02H 3/20; H02H 9/04; H01H 50/44
See application file for complete search history.

(56) References Cited

U.S. PATENT DOCUMENTS

| | | | | |
|---|---|---|---|---|
| 4,025,821 A | * | 5/1977 | Lang | H01H 83/20 361/111 |
| 10,594,321 B1 | * | 3/2020 | Funyu | H03K 19/17728 |
| 2009/0040666 A1 | * | 2/2009 | Elms | H02H 1/0015 361/42 |
| 2012/0154972 A1 | * | 6/2012 | McMahon | H02H 3/335 361/187 |
| 2016/0109521 A1 | * | 4/2016 | Salas | H02H 3/335 324/415 |
| 2016/0139192 A1 | * | 5/2016 | Okerman | G01R 31/50 324/509 |
| 2016/0363627 A1 | * | 12/2016 | Epee | G01R 31/3277 |
| 2018/0366291 A1 | * | 12/2018 | Jiao | H01H 83/04 |
| 2019/0097409 A1 | * | 3/2019 | Chen | H02H 3/162 |
| 2019/0199080 A1 | * | 6/2019 | Schmalz | H02H 3/26 |

* cited by examiner

*Primary Examiner* — Adolf D Berhane
(74) *Attorney, Agent, or Firm* — Eckert Seamans Cherin & Mellott, LLC

(57) ABSTRACT

A circuit interrupter including a line conductor, a neutral conductor, separable contacts, an operating mechanism structured to trip open the separable contacts, a magnetic trip actuator structured to cause the operating mechanism to trip open the separable contacts in response to a short-circuit between the line and neutral conductors, a protection circuit including a self-test circuit structured to perform a self-test and to output a signal in response to failing the self-test, and an electrical component electrically connected between the line and neutral conductors and having an open state and a closed state. The electrical component is structured to switch from the open state to the closed state and cause a short-circuit between the line and neutral conductors in response to receiving the signal from the self-test circuit.

16 Claims, 4 Drawing Sheets

CIRCUIT INTERRUPTER WITH SELF-TEST CIRCUIT AND METHOD OF OPERATING A CIRCUIT INTERRUPTER

BACKGROUND

Field

The disclosed concept relates generally to circuit interrupters, and in particular, to circuit interrupters with a self-test function.

Background Information

Circuit interrupters, such as for example and without limitation, circuit breakers, are typically used to protect electrical circuitry from damage due to an overcurrent condition, such as an overload condition, a short circuit, or another fault condition, such as an arc fault or a ground fault. Circuit interrupters typically include separable contacts. The separable contacts may be operated either manually by way of an operator handle or automatically in response to a detected fault condition. Typically, such circuit interrupters include an operating mechanism, which is designed to rapidly open the separable contacts, and a trip mechanism, such as a trip unit, which senses a number of fault conditions to trip the separable contacts open automatically. Upon sensing a fault condition, the trip unit trips the operating mechanism to a trip state, which moves the separable contacts to their open position.

Some types of circuit interrupters include a self-testing capability. The self-testing capability tests the circuit interrupter's capability of detecting and tripping in response to a fault. An example circuit interrupter design includes an electronically controlled trip actuation path where an output of a processor turns on a silicon controlled rectifier (SCR), which allows current to flow through a solenoid and cause the solenoid to actuate. Actuation of the solenoid causes the separable contacts of the circuit interrupter to trip open. The example circuit interrupter is designed to turn on the SCR to initiate a trip in response to failing a self-test. However, if the cause of the failure is in the trip actuation path (e.g., the SCR or solenoid have failed), the circuit interrupter will not be able to trip open the separable contacts in response to failing the self-test. Until the failure in the trip actuation path is remedied or the circuit interrupter is replaced, the circuit interrupter is unable to protect the circuit it is intended to protect.

There is room for improvement in circuit interrupters.

There is also room for improvement in methods of operating circuit interrupters.

SUMMARY

These needs and others are met by embodiments of the disclosed concept in which a circuit interrupter includes an electrical component that is controlled to cause a short circuit and trigger short circuit protection in response to a self-test failure.

In accordance with one aspect of the disclosed concept, a circuit interrupter comprises: a line conductor; a neutral conductor; separable contacts; an operating mechanism structured to trip open the separable contacts; a magnetic trip actuator structured to cause the operating mechanism to trip open the separable contacts in response to a short-circuit between the line and neutral conductors; a protection circuit including a self-test circuit structured to perform a self-test and to output a signal in response to failing the self-test; and an electrical component electrically connected between the line and neutral conductors and having an open state and a closed state, wherein the electrical component is structured to switch from the open state to the closed state and cause a short-circuit between the line and neutral conductors in response to receiving the signal from the self-test circuit.

In accordance with another aspect of the disclosed concept, a method of operating a circuit interrupter including a line conductor, a neutral conductor, separable contacts, and an operating mechanism structured to trip open the separable contacts comprises: providing a magnetic trip actuator structured to cause the operating mechanism to trip open the separable contacts in response to a short-circuit between the line and neutral conductors; providing a protection circuit including a self-test circuit structured to perform a self-test and to output a signal in response to failing the self-test; providing an electrical component electrically connected between the line and neutral conductors and having an open state and a closed state, wherein the electrical component is structured to switch from the open state to the closed state and cause a short-circuit between the line and neutral conductors in response to receiving the signal from the self-test circuit; performing the self-test with the self-test circuit; outputting the signal in response to failing the self-test; and switching the electrical component from the open state to the closed state in response to the signal.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
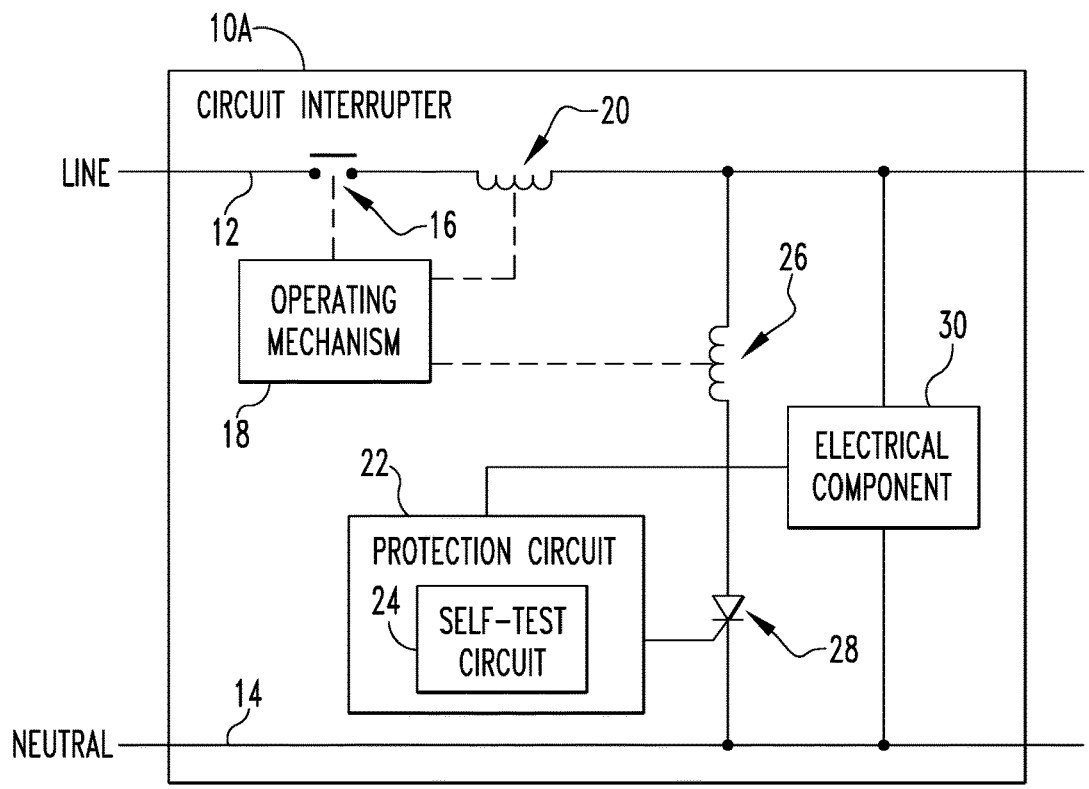
FIG. 1 is a schematic diagram of a circuit interrupter including an electrical component in accordance with an example embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

As employed herein, the term "processor" shall mean a programmable analog and/or digital device that can store, retrieve, and process data; a microprocessor; a microcontroller; a microcomputer; a central processing unit; or any suitable processing device or apparatus.

FIG. 1 is a schematic diagram of a circuit interrupter 10A in accordance with an example embodiment of the disclosed concept. The circuit interrupter 10A is structured to be electrically connected on a protected circuit between a power source (not shown) and a load (not shown). Power from the power source is conducted through the circuit interrupter 10A to the load via line and neutral conductors 12,14 included in the circuit interrupter 10A.

The circuit interrupter 10A includes separable contacts 16. The separable contacts 16 are disposed along the line conductor 12 and tripping open the separable contacts 16 stops current from flowing through the line conductor 12 from the power source to the load. The circuit interrupter 10A further includes an operating mechanism 18 structured to trip open the separable contacts 16. In some example embodiments of the disclosed concept, the separable contacts 16 include a fixed contact and a moveable contact. The operating mechanism 18 may be a mechanism including, for example, a lever arm, that pulls the moveable contact away from the fixed contact in order to trip open the separable contacts 16. The operating mechanism 18 may be triggered to trip open the separable contacts in response to activation of an actuator such as a solenoid.

The circuit interrupter 10A also includes a magnetic trip actuator 20. The magnetic trip actuator 20 includes a coil electrically connected in series with the line conductor 12 such that current flowing through the line conductor 12 flows through the coil of the magnetic trip actuator 20. The magnetic trip actuator 20 also includes an actuator member (not shown). The magnetic trip actuator 20 is a solenoid formed from the coil and the actuator member. A threshold current flowing through the line conductor 12, and thus through the coil of the magnetic trip actuator 20, causes the magnetic trip actuator 20 to actuate. The magnetic trip actuator 20 is structured to interact with the operating mechanism 18 such that when the magnetic trip actuator 20 actuates, it causes the operating mechanism 18 to trip open the separable contacts 16.

In some example embodiments, the threshold current is a current associated with an overcurrent fault corresponding to the circuit interrupter 10A. A short circuit between the line and neutral conductors 14 will also cause the threshold current to be reached in the line conductor 12 and cause the magnetic trip actuator 20 to actuate. In some example embodiments, the short circuit may cause a peak inrush current of 300 A. However, it will be appreciated that the peak inrush current may be different without departing from the scope of the disclosed concept. The magnetic trip actuator 20, in combination with the operating mechanism 18 and separable contacts 16, provides overcurrent and short circuit protection for the circuit interrupter 10A.

The circuit interrupter 10A also includes a protection circuit 22. The protection circuit 22 is structured to sense one or more fault conditions in the protected circuit and to initiate a trip in response to detecting a fault condition. The protection circuit 22 may receive input from one or more sensors (not shown), such as current, voltage, or temperature sensors to sense faults in the protected circuit. The protection circuit 22 may sense one or more of various types of faults without departing from the scope of the disclosed concept. For example and without limitation, the protection circuit 22 may sense one or more of a ground fault, an arc fault, an overcurrent fault, or other types of faults. In response to sensing a fault, the protection circuit 22 may output a trip signal to an SCR 28. The protection circuit 22 may include a processor (not shown) a processor structured to implement at least a portion of its functionality. For example and without limitation, the processor may receive inputs from the one or more sensors and analyze the inputs to determine whether a fault condition exists. The processor may also determine whether and when to output the trip signal in response to detecting the fault condition.

The circuit interrupter 10A includes a trip coil 26 and an SCR 28 electrically connected in series between the line and neutral conductors 12,14. The gate of the SCR 28 is electrically connected to the protection circuit 22 and is structured to receive the trip signal from the protection circuit 22 at its gate. In response to receiving the trip signal, the SCR 28 turns on and allows current to flow from the line conductor 12 to the neutral conductor 14 through the trip coil 26. The trip coil 26 is part of a solenoid which actuates in response to the current flowing through. When the solenoid actuates, it interacts with the operating mechanism 18 and causes the operating mechanism 18 to trip open the separable contacts. It will be appreciated by those having ordinary skill in the art that other suitable types of activation circuits may be used in place of the SCR 28. For example and without limitation, any type of electrically controlled switch or similar device may be used in place of the SCR 28 without departing from the scope of the disclosed concept.

The protection circuit 22 also includes a self-test circuit 24. The self-test circuit 24 is structured to provide self-testing capabilities for the circuit interrupter 10A. The self-testing capabilities include testing whether the circuit interrupter 10A can detect fault conditions and trip open the separable contacts 16 in response to detecting a fault condition. For example, the self-test circuit can perform a self-test to determine whether the protection circuit 22 is capable of detecting faults such as an arc fault or a ground fault. The self-testing capabilities may include testing the integrity of components involved in the tripping process such as the protection circuit 22, the SCR 28, and the trip coil 26. The self-test circuit 24 may use any components and arrangement of components known in the art of circuit interrupter self-testing.

The self-test circuit 24 is structured to output a self-test failure signal in response to a failed self-test. The self-test circuit 24 is structured to output the self-test failure signal to an electrical component 30.

The electrical component 30 is electrically connected between the line and neutral conductors 12,14. The electrical component 30 has an open state and a closed state. In the open state, the electrical component 30 does not allow current to flow through it between the line and neutral conductors 12,14. In the closed state, current is able to flow between the line and neutral conductors 12,14 through the electrical component 30. The electrical component 30 is a normally in the open state. In response to receiving the self-test failure signal from the self-test circuit 24, the electrical component 30 changes to the closed state. When the electrical component 30 changes to the closed state, it causes a short-circuit between the line and neutral conductors 12,14. The short-circuit causes the current in the line conductor 12 to exceed the threshold current associated with the magnetic trip actuator 20, which in turn causes the magnetic trip actuator 20 to actuate and cause the operating mechanism 18 to trip open the separable contacts 16.

The electrical component 30 may be any suitable type of normally open component. For example and without limitation, the electrical component 30 may be an SCR 32 (shown in FIG. 2), a triac 34 (shown in FIG. 3), a relay 36 (shown in FIG. 4) or any other suitable component or arrangement of components that is normally in an open state and changes to the closed state in response to receiving the self-test failure signal.

The protection circuit 22, the SCR 28, and the trip coil 26 provide typical fault protection. In the event of a self-test failure, the circuit interrupter 10A should be considered unable to provide fault protection. The separable contacts 16 should be tripped open. In conventional circuit interrupters, a signal would be output to the SCR 28 to activate it and cause the trip coil 26 to activate and cause the separable contacts 16 to trip open. However, if there is a failure in the protection circuit 22, such as the processor in the protection circuit failing and being unable to output the trip signal to the SCR 28, the protection circuit 22 would be unable to initiate a trip via the SCR 28. Additionally, if the SCR 28 or trip coil 26 failed, causing a trip via the SCR 28 would not be possible. The electrical component 30 and the magnetic trip actuator 20 provide a low cost redundant solution for tripping open the separable contacts 16 due to a self-test failure. Thus, even if the protection circuit 22, the SCR 28, or the trip coil 26 have failed and are unable to trip open the separable contacts 16, the electrical component 30 and magnetic trip actuator 20 can trip open the separable contacts 16 until the circuit interrupter 10A can be repaired or replaced.

In some example embodiments of the disclosed concept, the self-test circuit 24 may selectively initiate a trip due to a self-test failure via the SCR 28 or the electrical component 30. For example and without limitation, the self-test circuit 24 may determine that the self-test failure is due to the trip actuation path being non-functional and only initiate a trip via the electrical component 30 due to this type of failure. The trip actuation path being non-functional may be determined by a failure of the processor of the protection circuit 22 or a permanent failure of the SCR 28 or the trip coil 26. For other types of self-test failures, the self-test circuit 24 may initiate a trip by outputting a signal to the SCR 28 and causing a trip to be initiated by the SCR 28 and the trip coil 26.

When the electrical component 30 switches to the closed state, a low resistance path is formed between the line and neutral conductors 12,14, which causes a short circuit. In some example embodiments, when the electrical component 30 switches to the closed state, an instantaneous peak inrush current (e.g., without limitation, 300 A) through the line conductor 12 causes the magnetic trip actuator 20 to actuate and cause the separable contacts 16 to trip open. In some example embodiments, the low resistance path has a resistance of about 500 mΩ. In some example embodiments, the electrical component 30 is not rated for continuous current flow at the instantaneous peak inrush current. The electrical component 30 can be rated for a lower continuous current, which reduces the cost of the part. The instantaneous peak inrush current will only be experienced briefly before the separable contacts 16 are tripped open to stop the current.

In some example embodiments of the disclosed concept, the electrical component 30 may be structured to permanently switch to the closed state and render the circuit interrupter 10A inoperable. That is, the electrical component 30 may switch to the closed state and be unable to return to the open state such that there is a permanent short circuit between the line and neutral conductors 12,14. For example, the electrical component 30 may include a spring stretched or compressed to store potential energy that can be released causing a short circuit between the line and neutral conductors 12,14. As an example, the electrical component 30 can include a small fusible wire, which normally does not pass current. When the self-test is failed, a current is passed through fusible wire heating it up to the point of fusing and releasing the spring to its default position, allowing a short to be created between the line and neutral conductors 12,14. It will be appreciated that thermal deformation, magnetic attraction, phase-change or other principles may be employed to cause the electrical component 30 to permanently switch to the closed state. In some example embodiments, the electrical component 30 may only be switched to the closed state in response to certain types of failed self-tests, such as failures that render the circuit interrupter 10A unable to trip open the separable contacts 16 via the trip coil 26.

Figure 2:
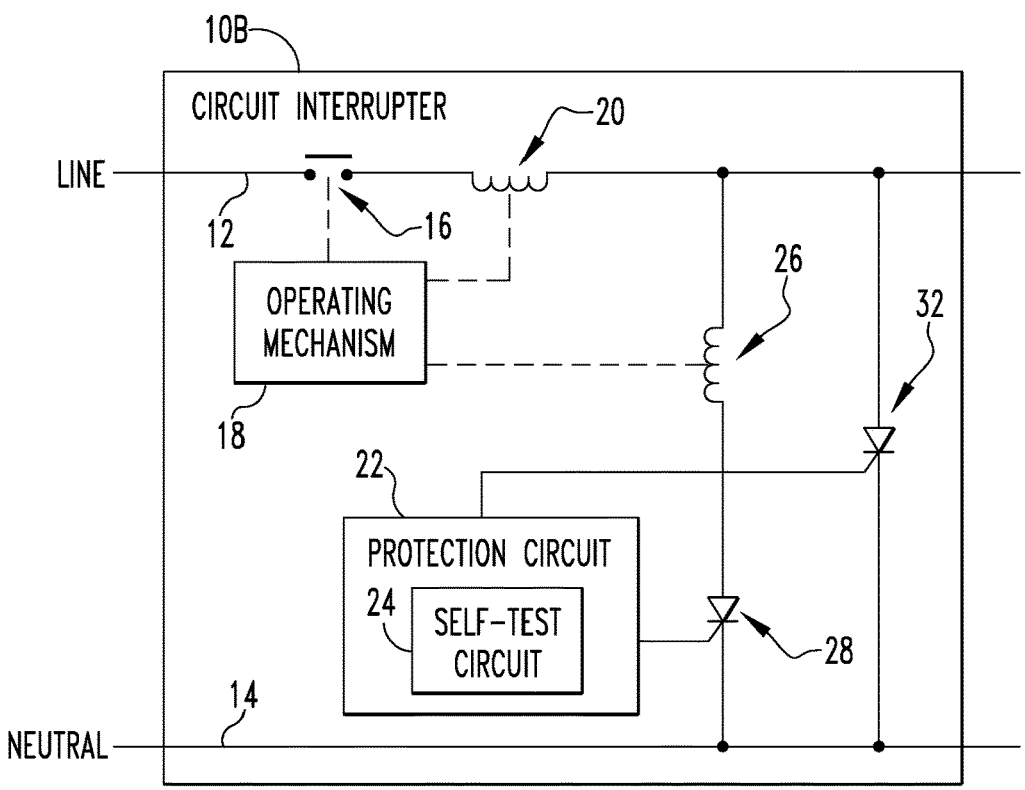
FIG. 2 is a schematic diagram of a circuit interrupter including an SCR as the electrical component in accordance with an example embodiment of the disclosed concept.

FIG. 2 is a schematic diagram of a circuit interrupter 10B in accordance with an example embodiment of the disclosed concept. The circuit interrupter 10B of FIG. 2 is similar to the circuit interrupter 10A of FIG. 1. However, in the circuit interrupter 10B of FIG. 2, the electrical component 30 is an SCR 32. The SCR 32 has a gate that is electrically connected to the self-test circuit 24. The SCR 32 is structured to receive the self-test failure signal at its gate. In response to receiving the self-test failure signal, the SCR 32 activates (i.e., changes from the open state to the close state), which creates a low resistance path between the line and neutral conductors 12,14. In response, the line conductor 12 experiences a peak inrush current and the magnetic trip actuator 20 actuates and causes the separable contacts 16 to trip open.

Figure 3:
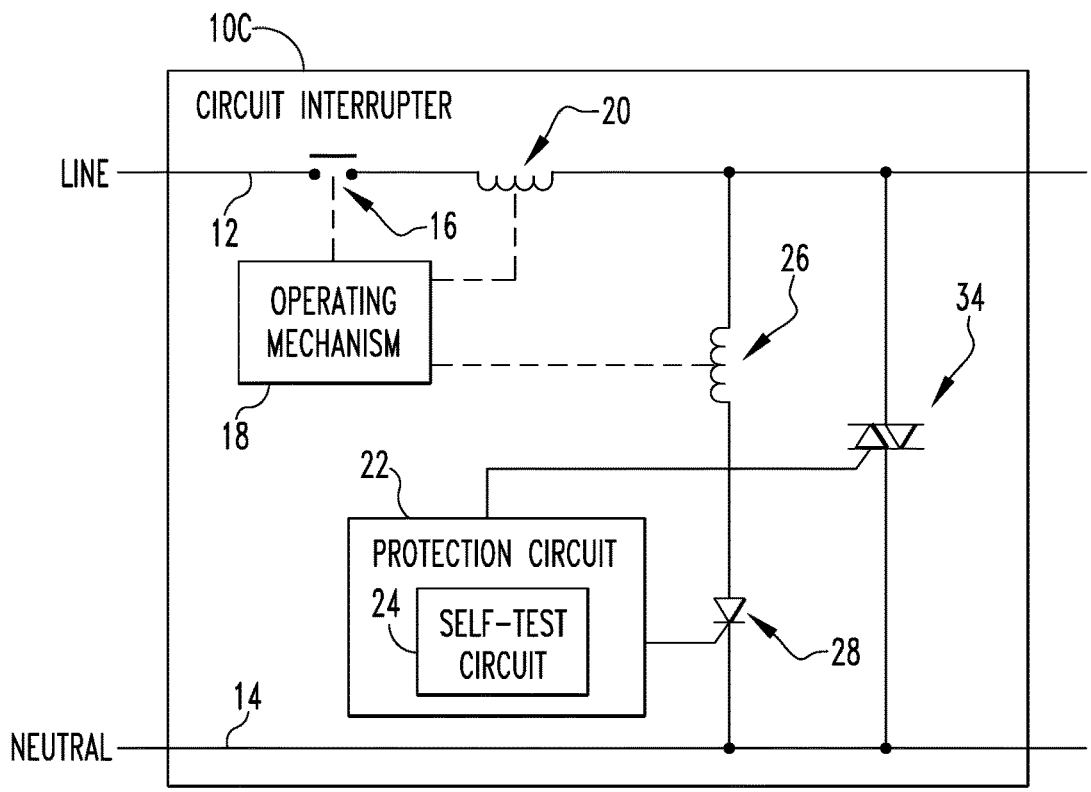
FIG. 3 is a schematic diagram of a circuit interrupter including a TRIAC as the electrical component in accordance with an example embodiment of the disclosed concept.

FIG. 3 is a schematic diagram of a circuit interrupter 10C in accordance with an example embodiment of the disclosed concept. The circuit interrupter 10C of FIG. 3 is similar to the circuit interrupter 10A of FIG. 1. However, in the circuit interrupter 10C of FIG. 3, the electrical component 30 is a triac 34. The triac 34 has a gate that is electrically connected to the self-test circuit 24. The triac 34 is structured to receive the self-test failure signal at its gate. In response to receiving the self-test failure signal, the triac 34 activates (i.e., changes from the open state to the close state), which creates a low resistance path between the line and neutral conductors 12,14. In response, the line conductor 12 experiences a peak inrush current and the magnetic trip actuator 20 actuates and causes the separable contacts 16 to trip open.

Figure 4:
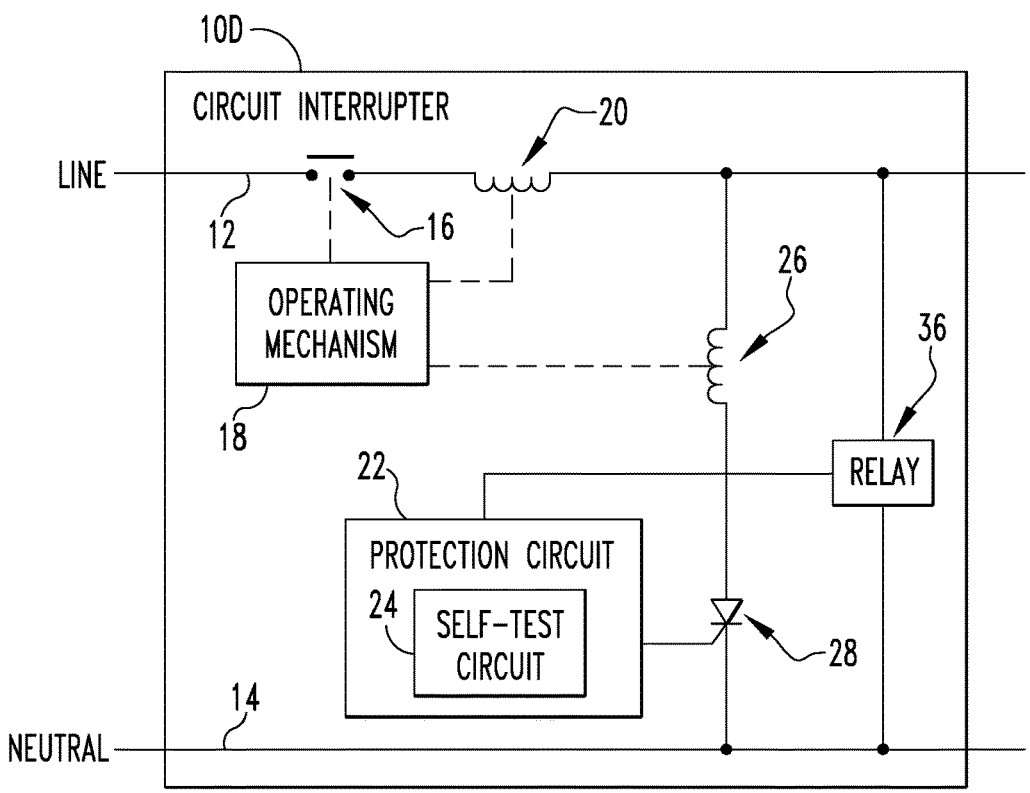
FIG. 4 is a schematic diagram of a circuit interrupter including a relay as the electrical component in accordance with an example embodiment of the disclosed concept.

FIG. 4 is a schematic diagram of a circuit interrupter 10D in accordance with an example embodiment of the disclosed concept. The circuit interrupter 10D of FIG. 4 is similar to the circuit interrupter 10A of FIG. 1. However, in the circuit interrupter 10D of FIG. 4, the electrical component 30 is a relay 36. The relay 36 is electrically connected to the self-test circuit 24. The relay 36 is structured to receive the self-test failure signal and close in response to receiving the self-test failure signal. In response, the line conductor 12 experiences a peak inrush current and the magnetic trip actuator 20 actuates and causes the separable contacts 16 to trip open.

Figure 5:
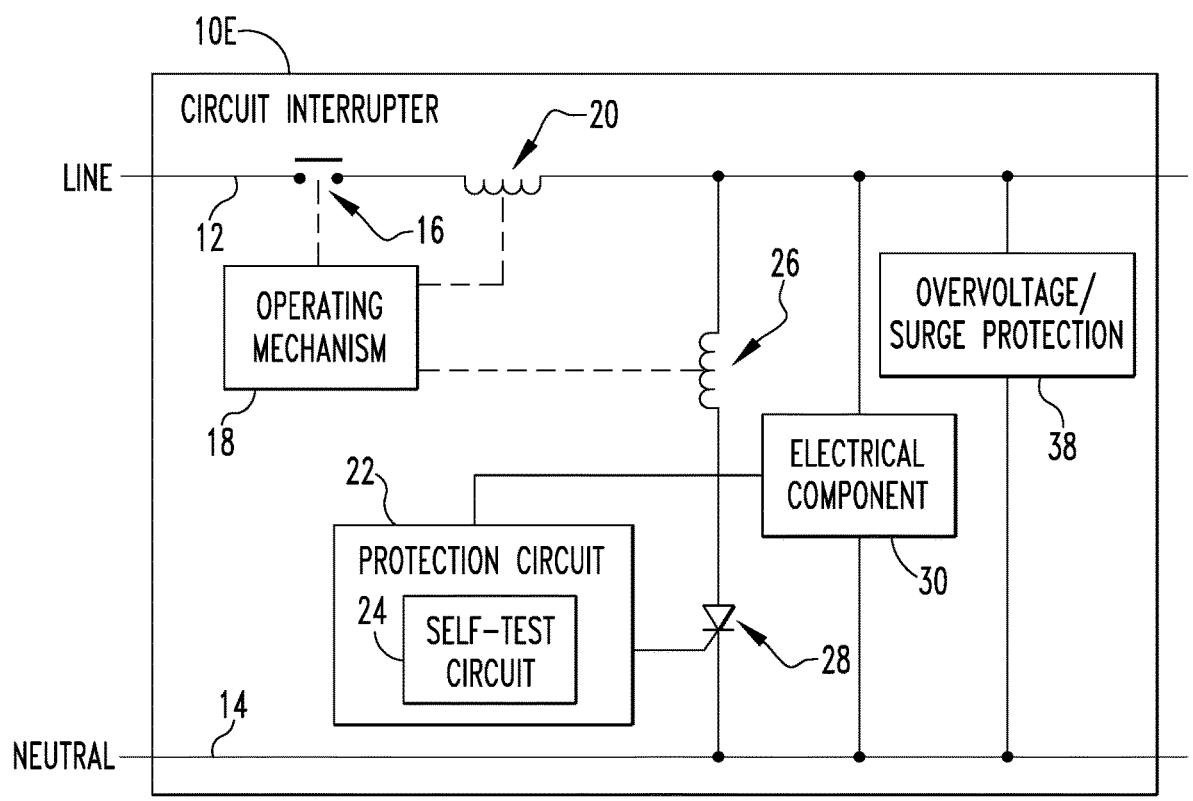
FIG. 5 is a schematic diagram of a circuit interrupter including overvoltage/surge protection in accordance with an example embodiment of the disclosed concept.

FIG. 5 is a schematic diagram of a circuit interrupter 10E in accordance with an example embodiment of the disclosed concept. The circuit interrupter 10E of FIG. 5 is similar to the circuit interrupter 10A of FIG. 1. However, the circuit interrupter 10E of FIG. 5 includes an overvoltage/surge protection device 38. The overvoltage/surge protection device 38 is electrically connected between the line and neutral conductors 12,14. The overvoltage/surge protection device 38 is structured to provide voltage clamping which helps to prevent nuisance tripping during a voltage surge event. In some example embodiments of the disclosed concept, the overvoltage/surge protection device 38 may be one or more metal oxide varistors (MOVs).

Figure 6:
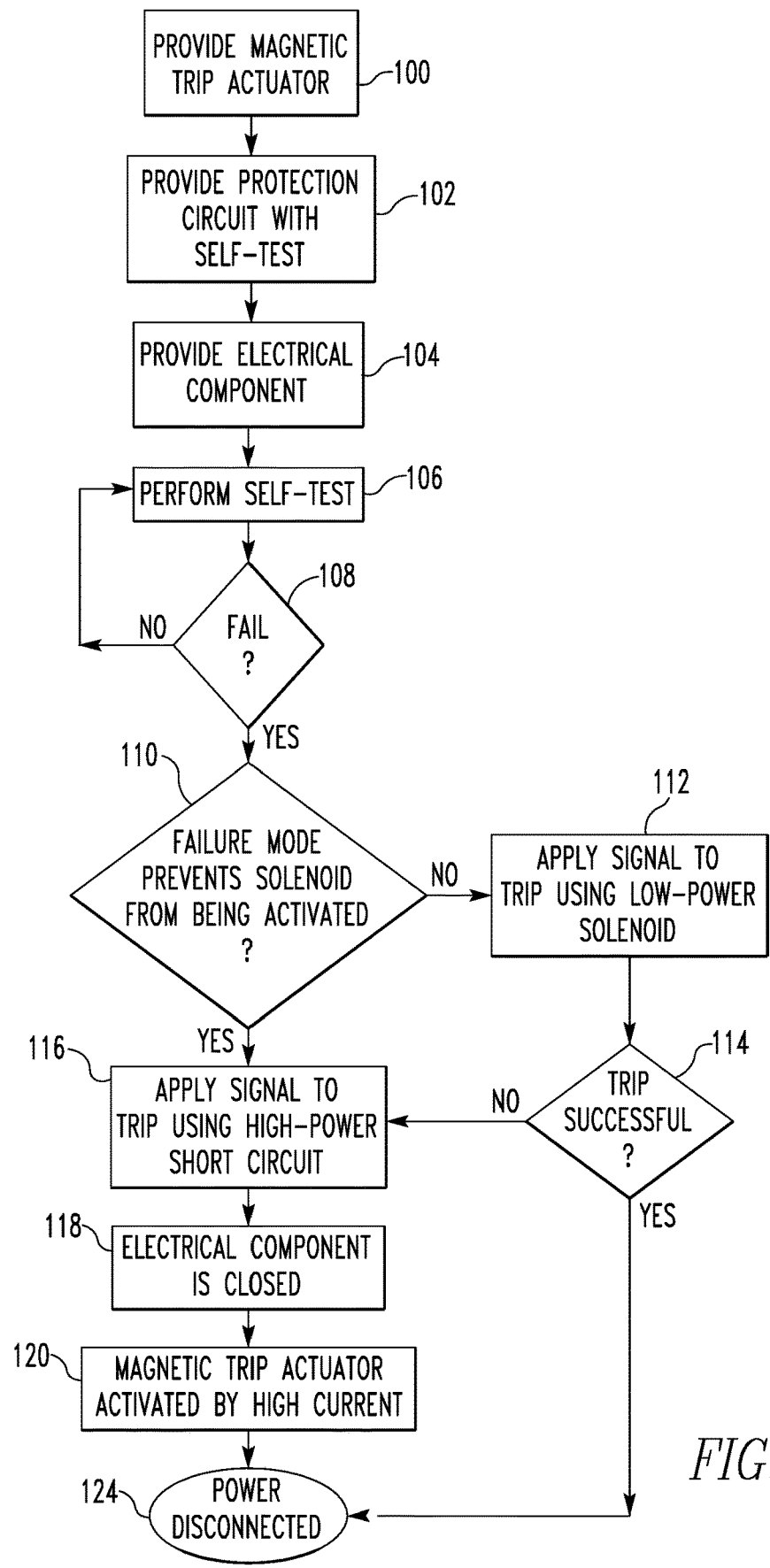
FIG. 6 is a flowchart of a method of operating a circuit interrupter in accordance with an example embodiment of the disclosed concept.

FIG. 6 is a method of operating a circuit interrupter in accordance with an example embodiment of the disclosed concept. The method may be implemented in any of the circuit interrupters shown in FIGS. 1-5 or any other suitable circuit interrupter that includes a line conductor, a neutral conductor, separable contacts, and an operating mechanism structured to trip open the separable contacts. For purposes of description, the method will be described in relation to the circuit interrupter 10A of FIG.

The method begins at 100 with providing a magnetic trip actuator 20 structured to cause the operating mechanism 18 to trip open the separable contacts 16 in response to a short-circuit between the line and neutral conductors 12,14. The method continues at 102 with providing a protection circuit 22 including a self-test circuit 24 structured to perform a self-test and to output a signal in response to failing the self-test. The method further continues at 104 with providing an electrical component 30 electrically connected between the line and neutral conductors 12,14 and having an open state and a closed state. The electrical component 30 is structured to switch from the open state to the closed state and cause a short-circuit between the line and neutral conductors 12,14 in response to receiving the signal from the self-test circuit 24.

At 106 a self-test with the self-test circuit 24 is performed. The self-test may be performed periodically. At 108 it is determined whether the self-test has been passed or failed. If the self-test has been passed, the method returns to 106. However, if the self-test has failed, the method proceeds to 110 where it is determined whether the failure prevents the circuit interrupter 10A from being able to trip open the separable contacts 16 via the trip coil 26 and its associated solenoid. If the failure does not prevent the circuit interrupter 10A from being able to trip open the separable contacts 16 via the trip coil 26 and its associated solenoid, the method proceeds to 112 where the self-test circuit 24 applies a signal to the SCR 28 which causes the trip coil 26 to attempt to activate and trip open the separable contacts 16 via its associated solenoid. At 114, it is determined whether the trip was successful. If the trip was successful, the method ends at 124 with power being disconnected from the load.

If the trip at 114 was not successful, the method proceeds to 116 where the self-test circuit 24 provides the signal to the electrical component 30 to cause the electrical component 30 to switch to the closed state at 118. The electrical component 30 closing causes a short circuit between the line and neutral conductors 12,14 which causes a high current to flow through the magnetic trip actuator 20 to cause the magnetic trip actuator 20 to actuate at 120 and initiate a short circuit trip. The method then ends at 124 with power being disconnected from the load.

One or more aspects of the disclosed concept can also be embodied as computer readable codes on a tangible, non-transitory computer readable recording medium. The computer readable recording medium is any data storage device that can store data which can be thereafter read by a computer system. Non-limiting examples of the computer readable recording medium include read-only memory (ROM), non-volatile random-access memory (RAM), CD-ROMs, magnetic tapes, floppy disks, disk storage devices, and optical data storage devices.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A circuit interrupter comprising:
a line conductor;
a neutral conductor;
separable contacts;
an operating mechanism structured to trip open the separable contacts;
a magnetic trip actuator structured to cause the operating mechanism to trip open the separable contacts in response to a short-circuit between the line and neutral conductors;
a protection circuit including a self-test circuit structured to perform a self-test and to output a signal in response to failing the self-test;
an electrical component electrically connected between the line and neutral conductors and having an open state and a closed state, wherein the electrical component is structured to switch from the open state to the closed state and cause a short-circuit between the line and neutral conductors in response to receiving the signal from the self-test circuit;
a trip coil; and
an electrically controlled activation circuit electrically connected in series with the trip coil between the line and neutral conductors,
wherein the protection circuit is structured to detect one or more fault conditions and to output a trip signal in response to detecting one or more fault conditions,
wherein the self-test includes testing the capability of the protection circuit to detect one or more fault conditions,
wherein the activation circuit is structured to activate and allow current to pass through it from the line conductor to the neutral conductor in response to receiving the trip signal, and
wherein the trip coil is structured to cause the operating mechanism to trip open the separable contacts in response to the activation circuit activating.

2. The circuit interrupter of claim 1, wherein the electrical component is one of a silicon controller rectifier, a triac, and a relay.

3. The circuit interrupter of claim 1, wherein the one or more fault conditions includes an arc fault; and wherein the self-test includes testing the capability of the protection circuit to detect an arc fault.

4. The circuit interrupter of claim 1, wherein the one or more fault conditions includes a ground fault; and wherein the self-test includes testing the capability of the protection circuit to detect a ground fault.

5. The circuit interrupter of claim 1, wherein the self-test circuit is structured to perform the self-test on one or more of the protection circuit, the activation circuit, and the trip coil; and wherein the self-test circuit is structured to output the signal in response to one or more of the protection circuit, the activation circuit, and the trip coil failing the self-test.

6. The circuit interrupter of claim 1, wherein the self-test circuit is structured to selectively output the signal to the electrical component or the activation circuit; wherein the self-test circuit is structured to determine whether a self-test failure is due to a failure in a trip actuation path; wherein the self-test circuit is structured to output the signal to the electrical component if the self-test failure is due to a failure in the trip actuation path and to otherwise output the signal to the activation circuit.

7. The circuit interrupter of claim 1, further comprising:
an overvoltage/surge protection device electrically connected between the line and neutral conductors,
wherein the overvoltage/surge protection device is structured to provide voltage clamping.

8. The circuit interrupter of claim 1, wherein the electrical component is structured to permanently switch to the closed state in response to receiving the signal from the self-test circuit.

9. A method of operating a circuit interrupter including a line conductor, a neutral conductor, separable contacts, and an operating mechanism structured to trip open the separable contacts, the method comprising:
providing a magnetic trip actuator structured to cause the operating mechanism to trip open the separable contacts in response to a short-circuit between the line and neutral conductors;
providing a protection circuit including a self-test circuit structured to perform a self-test and to output a signal in response to failing the self-test;
providing an electrical component electrically connected between the line and neutral conductors and having an open state and a closed state, wherein the electrical component is structured to switch from the open state to the closed state and cause a short-circuit between the line and neutral conductors in response to receiving the signal from the self-test circuit;
performing the self-test with the self-test circuit;
outputting the signal in response to failing the self-test;
switching the electrical component from the open state to the closed state in response to the signal;
detecting one or more fault conditions with the protection circuit:
outputting a trip signal in response to detecting one or more fault conditions,
providing a trip coil;
providing an electrically controlled activation circuit electrically connected in series with the trip coil between the line and neutral conductors and being structured to activate and allow current to pass through it from the line conductor to the neutral conductor; and
activating the activation circuit in response to receiving the trip signal,
wherein the self-test includes testing the capability of the protection circuit to detect one or more fault conditions, and
wherein the trip coil is structured to cause the operating mechanism to trip open the separable contacts in response to the activation circuit activating.

10. The method of claim 9, wherein the electrical component is one of a silicon controller rectifier, a triac, and a relay.

11. The method of claim 9, wherein the one or more fault conditions includes an arc fault; and wherein the self-test includes testing the capability of the protection circuit to detect an arc fault.

12. The method of claim 9, wherein the one or more fault conditions includes a ground fault; and wherein the self-test includes testing the capability of the protection circuit to detect a ground fault.

13. The method of claim 9, further comprising:
performing the self-test on one or more of the protection circuit, the activation circuit, and the trip coil; and
outputting the signal in response to one or more of the protection circuit, the activation circuit, and the trip coil failing the self-test.

14. The method of claim 9, further comprising:
determining whether a self-test failure is due to a failure in a trip actuation path; and
outputting the signal to the electrical component if the self-test failure is due to a failure in the trip actuation path and otherwise outputting the signal to the activation circuit.

15. The method of claim 9, further comprising:
providing an overvoltage/surge protection device electrically connected between the line and neutral conductors,
wherein the overvoltage/surge protection device is structured to provide voltage clamping.

16. The method of claim 15, wherein the electrical component is structured to permanently switch to the closed state in response to receiving the signal from the self-test circuit.

* * * * *